United States Patent [19]

Hermelin

[11] 4,108,549

[45] Aug. 22, 1978

[54] POLYCHROMIC REPRODUCTION PROCEDURE USING STRIPPABLE MASKS

[75] Inventor: Roger R. Hermelin, Olivet, France

[73] Assignee: Bureau de Recherches Geologiques et Minieres, Paris, France

[21] Appl. No.: 835,756

[22] Filed: Sep. 22, 1977

[30] Foreign Application Priority Data

Sep. 22, 1976 [FR] France .................... 76 28443

[51] Int. Cl.² .............. G03B 27/32; G03B 27/28; G03C 7/04; G03F 1/00
[52] U.S. Cl. .............................. 355/77; 96/5; 96/30; 355/125
[58] Field of Search .............. 96/14, 15, 16, 5, 30; 355/132, 125, 71, 79, 80, 81, 88, 32, 35, 77

[56] References Cited

U.S. PATENT DOCUMENTS

| | | | |
|---|---|---|---|
| 70,564 | 11/1867 | Heddon | 355/125 |
| 1,092,545 | 4/1914 | Snapp | 355/132 |
| 1,818,080 | 8/1931 | Miller | 96/30 |
| 2,246,561 | 6/1941 | Wheelan et al. | 355/125 X |
| 2,289,738 | 7/1942 | Seymour | 96/5 |
| 2,385,599 | 9/1945 | Ball et al. | 96/15 |
| 3,337,343 | 8/1967 | Hove | 96/5 X |

*Primary Examiner*—Donald A. Griffin
*Attorney, Agent, or Firm*—Sughrue, Rothwell, Mion, Zinn and Macpeak

[57] ABSTRACT

The claimed reproduction procedure avoids the use of as many masks as there are degrees of shading for each primary color.

For each primary color, only a single mask capable of being stripped and not painted in gouache is used. This mask serves as the mask assignable to the most densely shaded areas, and then upon stripping, as each of the masks assignable to the less densely shaded areas and so on to the weakest density. The mask acts as a photomask for a film which is underexposed for each degree of shading desired bymeans of a single screen.

The invention is applicable to the reproduction of all documents using a number of shades of color.

9 Claims, No Drawings

POLYCHROMIC REPRODUCTION PROCEDURE USING STRIPPABLE MASKS

FIELD OF THE INVENTION

The present invention concerns a polychromic reproduction procedure using masks and its application to the simultaneous reproduction of a variety of documents, especially maps. In accordance with the present invention a film is successively underexposed through a strippable mask and the resultant exposure times control the density of shading desired.

BACKGROUND OF THE INVENTION

Presently polychromic reproductions are prepared principally using a technique that involves making a mask for each area or group of areas corresponding to a given density for a selected color component. Typically this is done by painting a screen in gouache with a brush to create a screened negative corresponding to the desired density. With this technique one must create similar masks for each density and then assemble the masks of the different densities for each of the selected colors in the polychromatic system on the final positive. It is indispensable using this technique for routing of the successive masks to be carried out with very great precision. If it is not, overlappings which introduce new shades or white edges may be produced which injure the quality of the reproduction. Thus this method is a very tedious one, and requires as many screens as there are densities being used.

Because of the high cost of the screens, methods have been considered that facilitate the creation of intermediate screens with a reduction in the number of screens being the principal objective. However, all of the methods so far employed have finally required as many screened masks as there are areas of a specific density.

SUMMARY OF THE INVENTION

The main purpose of the present invention is to provide a polychromic reproduction procedure characterized by the use of a single mask capable of being stripped not painted in gouache for each of the primary colors which serves, successively as the mask assignable to the most densely shaded areas and then as each of the masks assignable to the less dense areas and so on to the weakest density as the areas of the mask assignable to the higher density and lesser densities are successively stripped from the mask. In accordance with the present invention a light-sensitive film is successively underexposed through the strippable mask after areas corresponding to the shadings desired are successively stripped from the mask. In this way, by using the same original strippable mask successively during the successive modifications, one avoids using different screens corresponding to each of the stripping modifications of the mask, and the screened intensity of the previous methods is replaced by the appropriate exposure times. One and the same screen is used for each primary color of the polychromic system being used.

Another purpose of the invention is to provide a procedure of this type which is especially adapted to cartography, characterized in that one only uses as reference shadings those which result from three primary colors, of which one only uses ten degrees of shading corresponding to screened values which only vary slightly in the pale shades and more pronouncedly in the strong shades, with this trichromic procedure possibly being used with black with a view to the precise reproduction of legends, contours and similar indications.

Other purposes and characteristics of the invention will be apparent from the detailed description that follows.

DESCRIPTION OF THE INVENTION

The description of the invention which follows was prepared in reference to a particular cartographic trichromic procedure with the understanding that the procedure with which the invention is concerned actually includes any suitable selection of color scales.

Thus, for the sole purpose of facilitating the account of the procedure with which the invention is concerned, in which one only uses one mask capable of being stripped for each primary color, that procedure will be described in reference to a particular system of cartographic trichromy which was specially devised for the purpose of illustrating that procedure.

In accordance with this system, the number of colors was limited to the three primary colors of the subtractive synthesis: yellow, magenta and cyan. Black can be added, depending upon the individual case, when it is necessary for drawing contours, adding text, legends, information regarding certain points and figures.

In order to permit better visual separation of the shadings, each of the three primary colors provides 10° of shading that are used, with 000 representing white and 999 black. Furthermore, since the eye separates shades below 50% pale more easily in order to facilitate reading the scale of screened values may be as follows:

| Degrees | 0 | 1 | 2 | 3 | 4 | 5 | 6 | 7 | 8 | 9 |
|---|---|---|---|---|---|---|---|---|---|---|
| Screened Values In Percentages | 0% | 5% | 10% | 20% | 30% | 40% | 50% | 60% | 80% | 100% |

Experience shows that this trichromic color scale offers enough color shades so that a very large number of maps can be made. Furthermore, black can be added to the three primary colors in order to darken certain shades.

When a reproduction is to be made, one begins by making a mask capable of being stripped for each primary color. An image of a map showing contours of the various areas to be reproduced according to standard tints or shades is produced in a strippable film. One such strippable film is the stabilene sensitized peelable film produced by Keuffel and Esser Company. This film peels in register with the exposed or scribed negative of the map contours. The most saturated areas (those of the 9th degree in the selected example) are the first to be stripped. The mask devoid of the most saturated area is put in place on a film by means of synchronizing perforations and then the film is exposed for 60 seconds. The film is screened from the light again and the mask is returned in order to strip the following degree (if it exists the 8th degree). Since there is only one mask the passage from a representation of an area of a specific degree to the area of one degree less is accomplished by simple subtraction. It is evident that using this procedure overflowing edges or white edges can never exist as in the previous procedures because the nature of covering areas in the same color when replacing one mask with another when areas of two different degrees are adjacent to each other is dispensed with. Thus, having stripped the 8th-degree areas on the mask which has already undergone stripping representing the 9th-degree areas, the film is exposed through this mask for 18 seconds. The result of this is that the 9th-degree areas receive a total exposure of 60 plus 18 seconds and the 8th-degree areas an exposure of 18 seconds. Thus, one proceeds in the same way by means of successive stripping of the 7th to the 1st-degree areas, with the exposure time corresponding to each area that has been stripped being as follows, for example:

| Degree | 9 | 8 | 7 | 6 | 5 | 4 | 3 | 2 | 1 |
|---|---|---|---|---|---|---|---|---|---|
| Time | 60" | 18" | 15" | 8" | 8" | 5" | 4" | 4" | 8" |

Thus, for each film assigned to a given primary color, one obtains nine clearly legible degrees of shading each corresponding to the total exposure time and density of reproduction.

| Degrees | 9 | 8 | 7 | 6 | 5 | 4 | 3 | 2 | 1 |
|---|---|---|---|---|---|---|---|---|---|
| Exposure | 130" | 70" | 52" | 37" | 29" | 21" | 16" | 12" | 8" |
| Density | 1 to 4 | 0.86 | 0.68 | 0.52 | 0.35 | 0.26 | 0.18 | 0.11 | 0.09 |

Thus, with the three films obtained (one for each of the primary colors in the trichromic system) one well-defined oritentation screen for each primary color. The angle formed by the direction of the screen is open by at least 30 degrees in order to obtain all the shades that are sought in reproduction by superposition of films.

Thus, in contrast with the former procedures, one is no longer forced to make as many screened masks for each color, reproducing the areas of the same degree, as there are degrees in the system of color scales being used, since a single strippable mask suffices for each color.

Furthermore, experience shows that the colors obtained in the system that has been described can be reproduced either in gray surface relief or screened. In addition, this procedure makes it possible to reproduce several maps of smaller dimensions or any other documents, simultaneously, by the use of just one offset machine of sufficient dimensions because of the relatively large number of shades being used and the similarity of the basic colors being employed, since this technique contributes to reducing the amount of time and reproduction materials required. This procedure is applied even when these shades are only close to those defined by weaker variations in intensity in the light shades than in the dark shades.

Obviously, the number of degrees used in the procedure can be made larger or smaller and the procedure can be made larger or smaller and the procedure will still be covered by the invention, since the percentages can vary in accordance with the system selected which could also include an additional color. In that instance, the number of masks and films would be the number of colors in the system.

As in the preceding case, each value is underexposed (except for the lightest ones) with the sum of the various exposures resulting in the ideal total time for each shade. Whatever particular system is adopted, the new procedure always presents the advantage of being faster, more reliable and less expensive because the number of screened masks is reduced.

In particular, the films used can be less sensitive than those used in the former procedures and they are also characterized by the fact that they suffice to create an offset plate assigned to the primary color under consideration after successive and repeated exposures, by means of a single screen, of all the areas of distinct degrees which one must reproduce.

What is claimed is:

1. A polychromatic reproduction procedure for obtaining a reproduction having a plurality of shading degrees for each primary color in the polychromatic system characterized by the fact that only one mask capable of being stripped is required to reproduce all the shading degrees for each primary color, said mask having recorded thereon areas to be shaded a plurality of shading degrees and serving sequentially as the mask for the areas to be most densely shaded and upon stripping as the mask for the areas to be shaded the remaining shading degrees, said procedure comprising:

stripping said mask of the areas to be most densely shaded, placing said mask on said light-sensitive film and underexposing said film to light to form underexposed areas corresponding to the areas to be most densely shaded;

subsequently stripping said mask of the next densest area, replacing said mask on said film and again underexposing said film to light such that the areas to be most densely shaded are again exposed and in addition underexposed areas are formed on said film corresponding to the next densest areas in said mask;

repeating said stripping and underexposing for each of the plurality of shading degrees, each time reexposing the denser areas and forming underexposed areas corresponding to the newly stripped dense area in said mask.

2. The process of claim 1 wherein the overall exposure times of the film vary in accordance with the shading degrees desired.

3. The process of claim 2 where black is used in said reproduction procedure for lettering and outlines.

4. The process of claim 3 where said polychromatic system is a trichromatic system.

5. The process of claim 4 wherein said three colors are cyan, magenta and yellow.

6. The process of claim 5 where black is added to the three colors.

7. The process of claim 2 where said shading degrees are selected to facilitate reading.

8. The process of claim 2 wherein one film is exposed for each color in the polychromatic system and the films are used simultaneously to form reproductions.

9. The process of claim 1 wherein said reproduction is a map.

* * * * *